US012400951B2

(12) United States Patent
Lo

(10) Patent No.: US 12,400,951 B2
(45) Date of Patent: Aug. 26, 2025

(54) SEMICONDUCTOR DEVICE AND METHOD OF MANUFACTURING THE SAME

(71) Applicant: NANYA TECHNOLOGY CORPORATION, New Taipei (TW)

(72) Inventor: Yi-Jen Lo, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 553 days.

(21) Appl. No.: 17/817,996

(22) Filed: Aug. 7, 2022

(65) Prior Publication Data
US 2024/0047340 A1 Feb. 8, 2024

(51) Int. Cl.
H01L 21/768 (2006.01)
H01L 23/48 (2006.01)
H01L 23/522 (2006.01)
H01L 23/532 (2006.01)

(52) U.S. Cl.
CPC .... H01L 23/5226 (2013.01); H01L 21/76814 (2013.01); H01L 21/76843 (2013.01); H01L 21/76877 (2013.01); H01L 21/76898 (2013.01); H01L 23/481 (2013.01); H01L 23/53238 (2013.01)

(58) Field of Classification Search
CPC ........... H01L 23/5226; H01L 21/76814; H01L 21/76843; H01L 21/76877; H01L 21/76898; H01L 23/481; H01L 23/53238; H01L 21/76844
See application file for complete search history.

(56) References Cited

U.S. PATENT DOCUMENTS 9,764,153 B2 * 9/2017 Tsai ..................... A61N 1/3987

OTHER PUBLICATIONS

Stefaan Van Huylenbroeck et al., "A Highly Reliable 1x5um via-last TSV Module", Electronic ISSN: 2380-6338, INSPEC Accession No. 18026308, DOI: 10.1109/IITC.2018.8430389, Aug. 16, 2018.

* cited by examiner

Primary Examiner — Samuel A Gebremariam
(74) Attorney, Agent, or Firm — CKC & Partners Co., LLC

(57) ABSTRACT

The present disclosure provides a method of manufacturing a semiconductor device. The method includes: forming a first via and a second via on a semiconductor structure, wherein the semiconductor structure includes a first dielectric layer, a first barrier layer, a first metal, a second barrier layer, a second dielectric layer, a substrate, and a second metal; forming a third dielectric layer on the substrate and a bottom and the inner sidewalls of the first via and the second via; punching through the third dielectric layer on the bottom of the first via and the second via; forming a third barrier layer on the substrate and in the first via and the second via; removing oxides formed from the first metal and the second metal; forming a fourth barrier layer; and forming a conductive material in the first via and the second via.

8 Claims, 10 Drawing Sheets

M

S101 — forming a first via and a second via on a semiconductor structure, in which the semiconductor structure includes a first dielectric layer, a first barrier layer on the first dielectric layer, a first metal on the first barrier layer, a second barrier layer on the first metal, a second dielectric layer on the second barrier layer, a substrate on the second dielectric layer, and a second metal in the second dielectric layer, in which the first via runs through the second dielectric layer and the substrate, and the second via at least runs through the substrate and is directly above the second metal S102 — forming a third dielectric layer on the substrate and a bottom and inner sidewalls of the first via and the second via S103 — punching through the third dielectric layer on the bottom of the first via and the second via to expose the first metal and the second metal

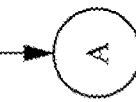

Fig. 1

SEMICONDUCTOR DEVICE AND METHOD OF MANUFACTURING THE SAME

BACKGROUND

Field of Invention

The present invention relates to a semiconductor device and a method of manufacturing the same.

Description of Related Art

In a conventional art of forming a semiconductor device, vias are usually produced in a dual through silicon via (TSV) process. For example, the conventional method of fabricating in a dual TSV scheme is to etch a dielectric layer to form vias. The vias are covered with barriers and filled with copper (Cu). In the semiconductor industry, Copper drift in a semiconductor device is an issue for current leakage or reliability concerns. It may lead to the re-sputtering of the copper onto the TSV liner oxide. If the re-sputtered copper is not protected against diffusion from the tantalum (Ta) barrier layer, a negative impact regarding the degradation of the TSV liner breakdown voltage due to this metal contamination may occur. This is likely to cause resistance variations in subsequent related processes, thereby reducing the performance of the entire semiconductor device. Therefore, a semiconductor device and method of manufacturing the same that can solve the aforementioned problems are of necessary need in the art.

SUMMARY

According to one embodiment of the present invention, a method of manufacturing a semiconductor device includes: forming a first via and a second via on a semiconductor structure, in which the semiconductor structure includes a first dielectric layer, a first barrier layer on the first dielectric layer, a first metal on the first barrier layer, a second barrier layer on the first metal, a second dielectric layer on the second barrier layer, a substrate on the second dielectric layer, and a second metal in the second dielectric layer, in which the first via runs through the second dielectric layer and the substrate, and the second via at least runs through the substrate and is directly above the second metal; forming a third dielectric layer on the substrate and a bottom and inner sidewalls of the first via and the second via; punching through the third dielectric layer on the bottom of the first via and the second via to expose the first metal and the second metal; forming a third barrier layer on the substrate and the bottom and the inner sidewalls of the first via and the second via; removing oxides formed from the exposed first metal and the exposed second metal and forming a re-sputtered first metal and a re-sputtered second metal at least on lower portions of the inner sidewalls of the first via and the second via respectively, so that the re-sputtered first metal and the re-sputtered second metal are separated from the third dielectric layer by the third barrier layer; forming a fourth barrier layer on the substrate and the bottom and the inner sidewalls of the first via and the second via; and forming a conductive material in the first via and the second via.

In another embodiment of the present invention, forming the conductive material in the first via and the second via further includes: filling the conductive material in the first via and the second via; and removing a portion of the fourth barrier layer on the third dielectric layer and a portion of the conductive material.

In one or more embodiments of the present invention, forming the third dielectric layer on the substrate and the bottom and the inner sidewalls of the first via and the second via is performed by a blanket deposition process.

In one or more embodiments of the present invention, forming the third barrier layer on the substrate and the bottom and the inner sidewalls of the first via and the second via is performed by a blanket deposition process.

In one or more embodiments of the present invention, removing the oxides formed from the exposed first metal and the second metal further includes: removing a portion of the third barrier layer on the bottom of the first via and a portion of the third barrier layer on the third dielectric layer.

In one or more embodiments of the present invention, removing the oxides formed from the exposed first metal and the second metal is performed by an in-situ argon plasma sputter cleaning process.

In one or more embodiments of the present invention, the re-sputtered first metal is formed from the first metal, and the re-sputtered second metal is formed from the second metal.

In one or more embodiments of the present invention, forming the fourth barrier layer on the substrate and the bottom and the inner sidewalls of the first via and the second via is performed by a blanket deposition process.

In one or more embodiments of the present invention, forming the third barrier layer on the substrate and the bottom and the inner sidewalls of the first via and the second via is performed after forming the third dielectric layer on the substrate and the bottom and the inner sidewalls of the first via and the second via.

In one or more embodiments of the present invention, forming the fourth barrier layer on the substrate and the bottom and the inner sidewalls of the first via and the second via is performed after forming the third barrier layer on the substrate and the bottom and the inner sidewalls of the first via and the second via.

In one or more embodiments of the present invention, forming the fourth barrier layer on the substrate and the bottom and the inner sidewalls of the first via and the second via further comprises: forming a seed layer on the substrate and the bottom and the inner sidewalls of the first via and the second via.

In one or more embodiments of the present invention, forming the seed layer on the substrate and the bottom and the inner sidewalls of the first via and the second via is performed before forming the conductive material in the first via and the second via.

In yet another embodiment of the present invention, a semiconductor device includes a first dielectric layer; a first barrier layer, a first metal, a second barrier layer, a second dielectric layer, a second metal, a substrate, a third dielectric layer, a first via, a second via, a third barrier layer, a re-sputtered first metal and a re-sputtered second metal, a fourth barrier layer, and a conductive layer. The first barrier layer is located on the first dielectric layer. The first metal is located on the first barrier layer. The second barrier layer is located on the first metal. The second dielectric layer is located on the second barrier layer. The second metal is located over the first metal. The second metal is disposed in the second dielectric layer. The substrate is located on the second dielectric layer. The first via runs through the substrate and the second dielectric layer to connect to the first metal. The second via at least runs through the substrate to connect to the second metal. The third dielectric layer is located on the substrate and inner sidewalls of the first via and the second via. The third barrier layer is located on the third dielectric layer and the inner sidewalls of the first via and the second via. The re-sputtered first metal and the re-sputtered second metal is at least located on lower portions of the inner sidewalls of the first via and the second via, respectively. The re-sputtered first metal and the re-sputtered second metal are separated from the third dielectric layer by the third barrier layer. The fourth barrier layer is located on the third barrier layer and on a bottom and the inner sidewalls of the first via and the second via. The fourth barrier layer covers the re-sputtered first metal and the re-sputtered second metal. The conductive material is filled in the first via and the second via.

In one or more embodiments of the present invention, the re-sputtered first metal and the re-sputtered second metal formed from the first metal and the second metal, respectively.

In one or more embodiments of the present invention, the re-sputtered first metal and the re-sputtered second metal are sandwiched between the third barrier layer and the fourth barrier layer.

In one or more embodiments of the present invention, a material of the first dielectric layer, a material of the second dielectric layer, and a material of the third dielectric layer are identical.

In one or more embodiments of the present invention, a material of the first barrier layer and a material of the second barrier layer are identical.

In one or more embodiments of the present invention, a material of the third barrier layer and a material of the fourth barrier layer are identical.

In one or more embodiments of the present invention, a material of the conductive material and a material of the first metal are identical.

In one or more embodiments of the present invention, the conductive material is leveled with the third dielectric layer.

In summary, in the semiconductor device and the method of manufacturing the same of present invention, since the steps of forming the third barrier layer and the fourth barrier layer are performed, the re-sputtered first metal and the re-sputtered second metal can be separated from the dielectric layers (e.g. the third dielectric layer), thereby reducing the probability of leakage, and improving its electrical performance.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 1 is a flow chart of a method of manufacturing a semiconductor device in accordance with an embodiment of present invention;

DETAILED DESCRIPTION

Figure 2:
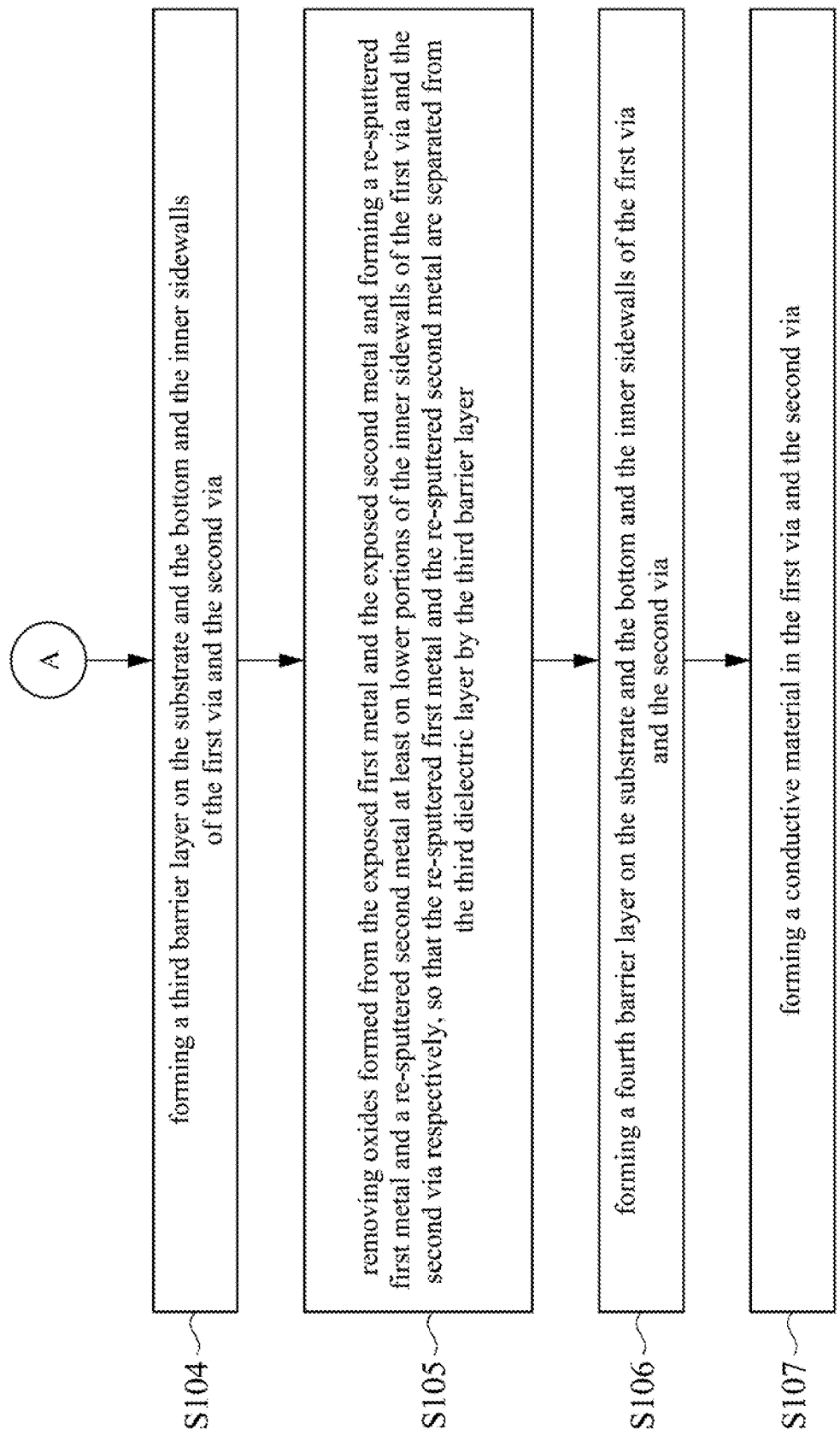
FIG. 2 is a flow chart of the method of manufacturing a semiconductor device continued from FIG. 1 in accordance with an embodiment of present invention.

Reference will now be made in detail to the present embodiments of the invention, examples of which are illustrated in the accompanying drawings. Wherever possible, the same reference numbers are used in the drawings and the description to refer to the same or like parts.

Reference is made to FIG. 1 and FIG. 2. FIG. 1 and FIG. 2 are flow charts of a method M of manufacturing a semiconductor device 100 as shown in FIG. 10 in accordance with an embodiment of present invention. The method M shown in FIG. 1 and FIG. 2 includes a step S101, a step S102, a step S103, a step S104, a step S105, a step S106, and a step S107. Please refer to FIG. 1 and FIG. 3 for better understanding the step S101. Please refer to FIG. 1 and FIG. 4 for better understanding the step S102. Please refer to FIG. 1 and FIG. 5 for better understanding the step S103. Please refer to FIG. 2, FIG. 6, and FIG. 7 for better understanding the step S104. Please refer to FIG. 2 and FIG. 8 for better understanding the step S105. Please refer to FIG. 2 and FIG. 9 for better understanding the step S106. Please refer to FIG. 2 and FIG. 10 for better understanding the step S107.

Step S101, step S102, step S103, step S104, step S105, step S106, and step S107 are described in detail below.

In step S101, a first via V1 and a second via V2 are formed on a semiconductor structure.

Figure 3:
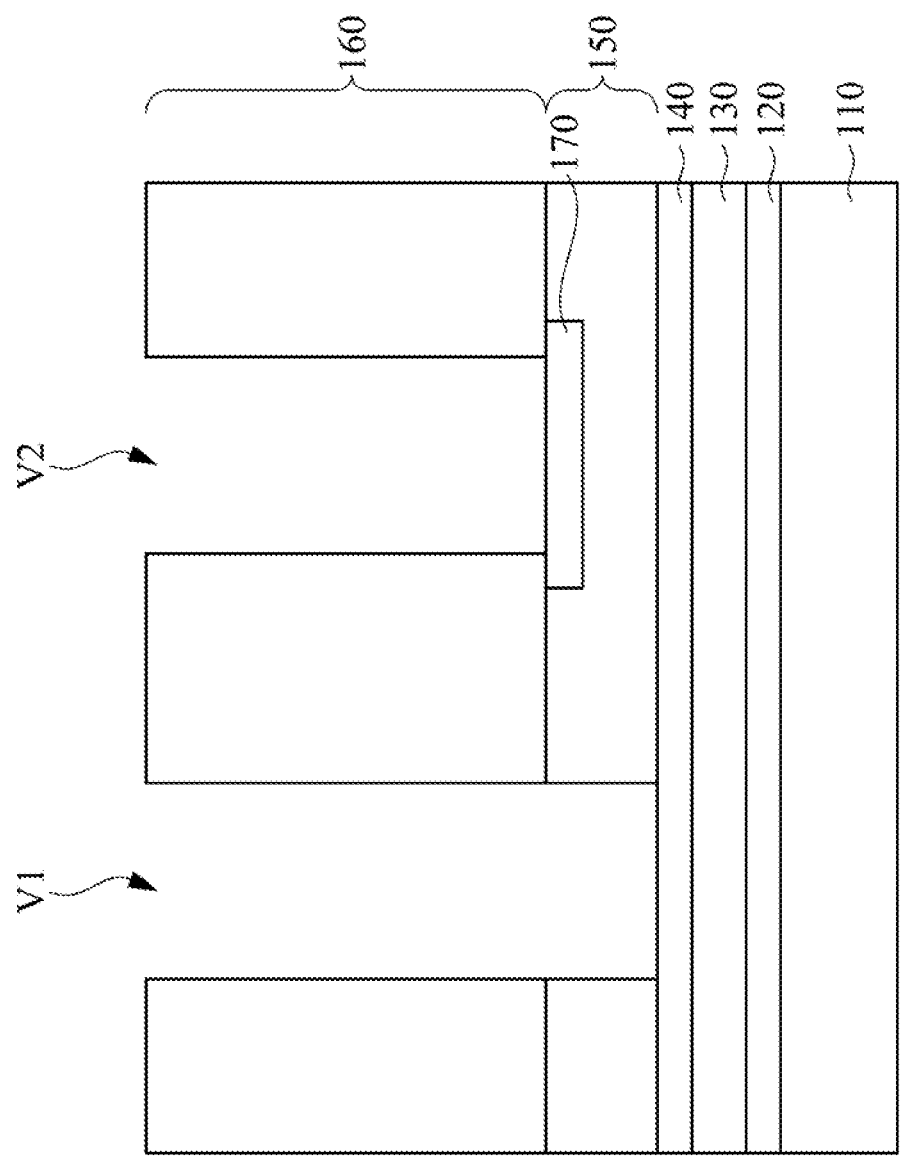
FIG. 3 is a cross-sectional view of an intermediate stage of manufacturing a semiconductor device in accordance with an embodiment of present invention.

Reference is made to FIG. 1 and FIG. 3. FIG. 3 is a cross-sectional view of an intermediate stage of manufacturing a semiconductor device 100 in accordance with an embodiment of present invention. As shown in FIG. 3, a semiconductor structure is provided. The semiconductor structure includes a first dielectric layer 110, a first barrier layer 120, a first metal 130, a second barrier layer 140, a second dielectric layer 150, a substrate 160, a second metal 170, a first via V1, and a second via V2. The first barrier layer 120 is located on the first dielectric layer 110. The first metal 130 is located on the first barrier layer 120. The second barrier layer 140 is located on the first metal 130. The second dielectric layer 150 is located on the second barrier layer 140. The substrate 160 is located on the second dielectric layer 150. The second metal 170 is located over the first metal 130. The second metal 170 is disposed in the second dielectric layer 150. In some embodiments, as shown in FIG. 3, a top surface of the second metal 170 is leveled with a top surface of the second dielectric layer 150, but the present invention is not limited thereto. The first via V1 is formed running through the second dielectric layer 150 and the substrate 160 to connect to the first metal 130. The second via V2 is formed by running through the substrate 160 to connect to the second metal 170. In some embodiments, as shown in FIG. 3, the second via V2 is directly above the second metal 170.

In some embodiments, the first dielectric layer 110 may include a material, such as silicon oxide ($Si_xO_y$), titanium oxide ($Ti_xO_y$), or the like. However, any suitable material may be utilized.

In some embodiments, the first dielectric layer 110 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present invention is not intended to limit the methods of forming the first dielectric layer 110.

In some embodiments, the first barrier layer 120 may include a material, such as silicon nitride ($Si_xN_y$), silicon carbon nitride (SiCN), or the like. However, any suitable material may be utilized.

In some embodiments, the first barrier layer 120 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present invention is not intended to limit the methods of forming the first barrier layer 120.

In some embodiments, the first metal 130 may include a material, such as copper (Cu), or the like. However, any suitable material may be utilized.

In some embodiments, the first metal 130 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present invention is not intended to limit the methods of forming the first metal 130.

In some embodiments, the second barrier layer 140 may include a material, such as silicon nitride ($Si_xN_y$), silicon carbon nitride (SiCN), or the like. However, any suitable material may be utilized.

In some embodiments, a material of the first barrier layer 120 and a material of the second barrier layer 140 are identical, but the present invention is not limited thereto.

In some embodiments, the second barrier layer 140 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present invention is not intended to limit the methods of forming the second barrier layer 140.

In some embodiments, the second dielectric layer 150 may include a material, such as silicon oxide ($Si_xO_y$), titanium oxide ($Ti_xO_y$), or the like. However, any suitable material may be utilized.

In some embodiments, the second dielectric layer 150 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present invention is not intended to limit the methods of forming the second dielectric layer 150.

In some embodiments, the substrate 160 may include a material, such as silicon-based material (for example, monocrystalline silicon, amorphous silicon, or polysilicon), or the like. However, any suitable material may be utilized.

In some embodiments, the substrate 160 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present invention is not intended to limit the methods of forming the substrate 160.

In some embodiments, the second metal 170 may include a material, such as aluminum (Al), or the like. However, any suitable material may be utilized.

In some embodiments, the second metal 170 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present invention is not intended to limit the methods of forming the second metal 170.

In some embodiments, the first via V1 and the second via V2 may be formed by any suitable method, for example, wet etching, dry etching, or the like. The present invention is not intended to limit the methods of forming the first via V1 and the second via V2.

In step S102, a third dielectric layer 180 is formed on the substrate 160 and a bottom and the inner sidewalls of the first via V1 and the second via V2.

Figure 4:
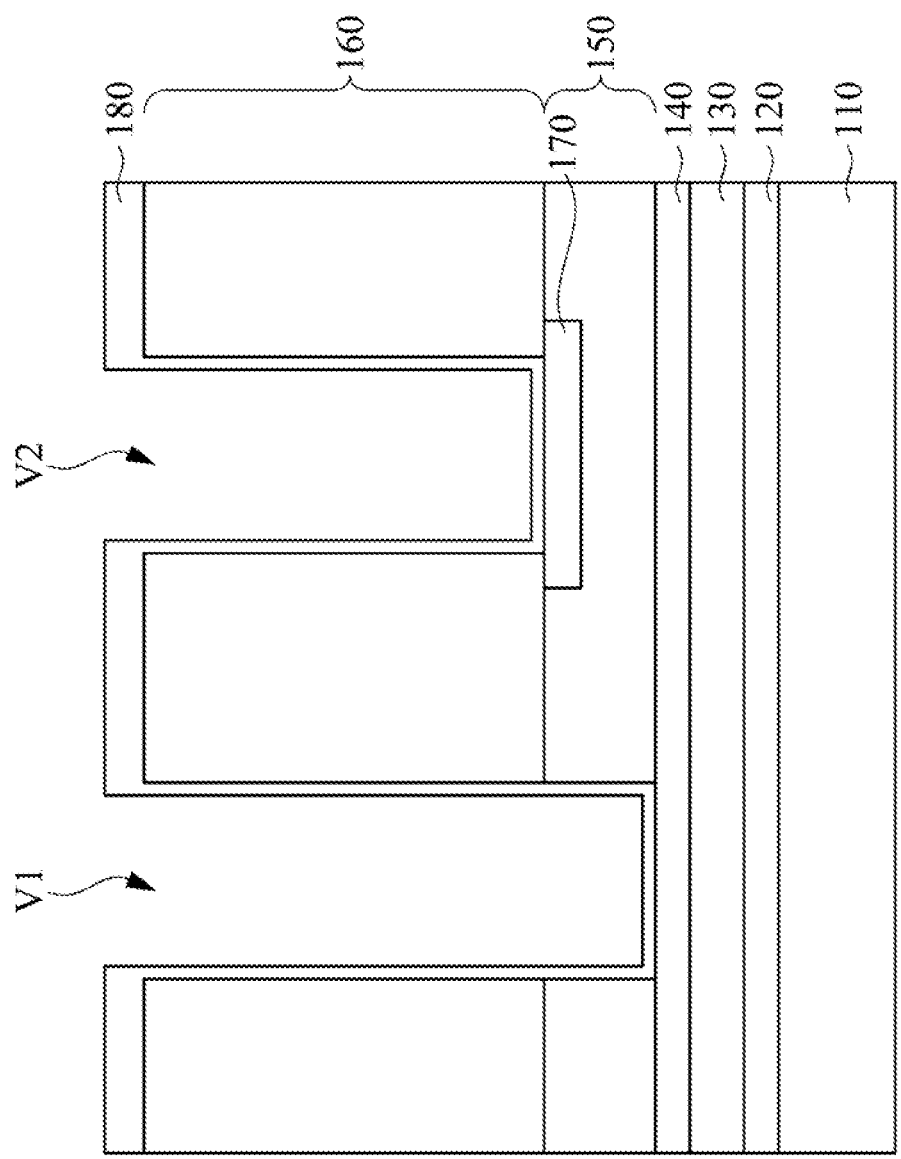
FIG. 4 is a cross-sectional view of an intermediate stage of manufacturing the semiconductor device in accordance with an embodiment of present invention.

Reference is made to FIG. 1 and FIG. 4. FIG. 4 is a cross-sectional view of an intermediate stage of manufacturing a semiconductor device 100 in accordance with an embodiment of the present invention. As shown in FIG. 4, the third dielectric layer 180 is formed in step S102. Specifically, the third dielectric layer 180 is at least deposited on the inner sidewalls of the first via V1 and the second via V2 of the semiconductor structure. This ensures that the inner sidewalls of the first via V1 and the second via V2 are lined with the third dielectric layer 180 during the forming of step S102.

In some embodiments, the third dielectric layer 180 may include a material, such as silicon oxide ($Si_xO_y$), titanium oxide ($Ti_xO_y$), or the like. However, any suitable material may be utilized.

In some embodiments, a material of the first dielectric layer 110, a material of the second dielectric layer 150, and a material of the third dielectric layer 180 are identical, but the present invention is not limited thereto.

In some embodiments, the third dielectric layer 180 may be deposited by a blanket depositing process. The present invention is not intended to limit the methods of depositing the third dielectric layer 180.

In some embodiments, the third dielectric layer 180 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present invention is not intended to limit the methods of forming the third dielectric layer 180.

In step S103, the third dielectric layer 180 is punched through on the bottom of the first via V1 and the second via V2 to expose the first metal 130 and the second metal 170.

Figure 5:
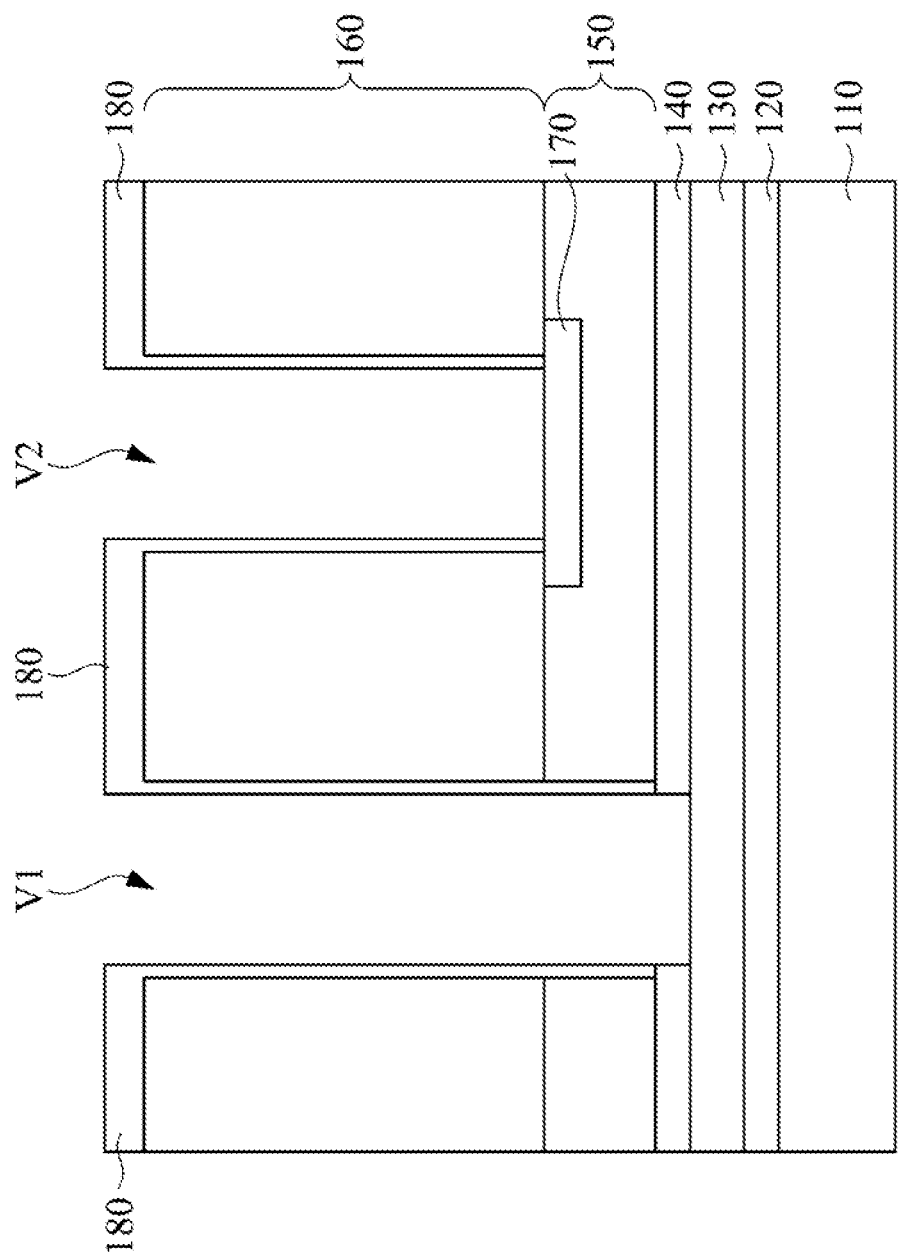
FIG. 5 is a cross-sectional view of an intermediate stage of manufacturing the semiconductor device in accordance with an embodiment of present invention.

Reference is made to FIG. 1 and FIG. 5. FIG. 5 is a cross-sectional view of an intermediate stage of manufacturing a semiconductor device 100 in accordance with an embodiment of present invention. As shown in FIG. 5, portions of the third dielectric layer 180 on the bottom of the first via V1 and the second via V2 is removed by punching, so that the first metal 130 and the second metal 170 are exposed. In some embodiments, a portion of the second barrier layer 140 on the bottom of the first via V1 is also removed by punching during performing step S103, so that the first metal 130 are exposed.

In some embodiments, the first metal 130 and the second metal 170 may be exposed by punching through the third dielectric layer 180 by any suitable method, for example, wet etching, dry etching, or the like. The present invention is not intended to limit the methods of exposing the first metal 130 and the second metal 170.

Figure 6:
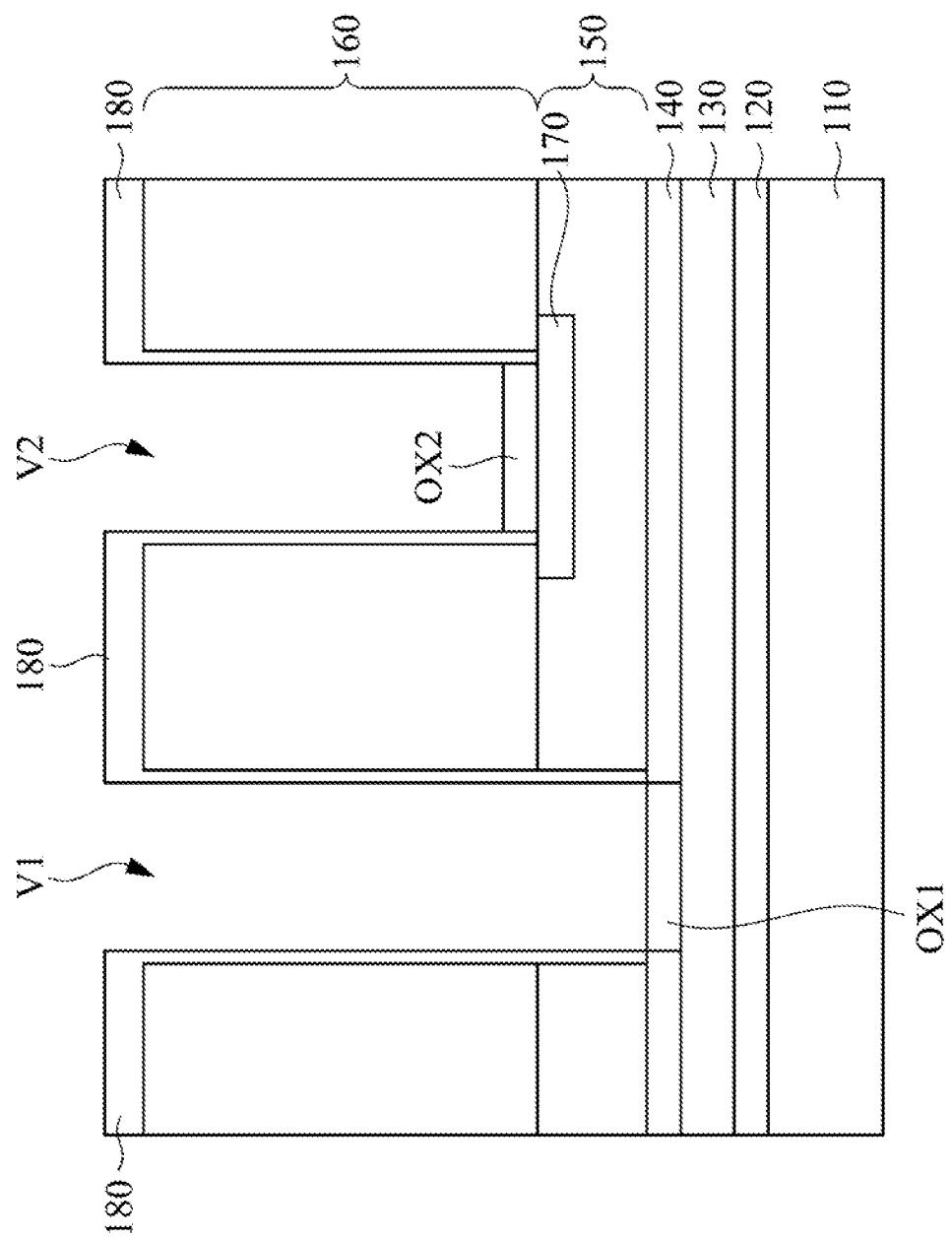
FIG. 6 is a cross-sectional view of an intermediate stage of manufacturing the semiconductor device in accordance with an embodiment of present invention.

Reference is made to FIG. 6. FIG. 6 is a cross-sectional view of an intermediate stage of manufacturing a semiconductor device 100 in accordance with an embodiment of the present invention. In some embodiments, a first oxide OX1 and a second oxide OX2 may be formed from the first metal 130 and the second metal 170, respectively. In some embodiments, the first oxide OX1 and the second oxide OX2 may be formed on a top surface of the first metal 130 and a top surface of the second metal 170 respectively due to air exposure. In some embodiments, the first oxide OX1 may include a material, such as copper oxide ($Cu_xO_y$). In some embodiments, the second oxide OX2 may include a material, such as aluminum oxide ($Al_xO_y$).

In step S104, a third barrier layer 190 is formed on the substrate 160 and the bottom and the inner sidewalls of the first via V1 and the second via V2.

Figure 7:
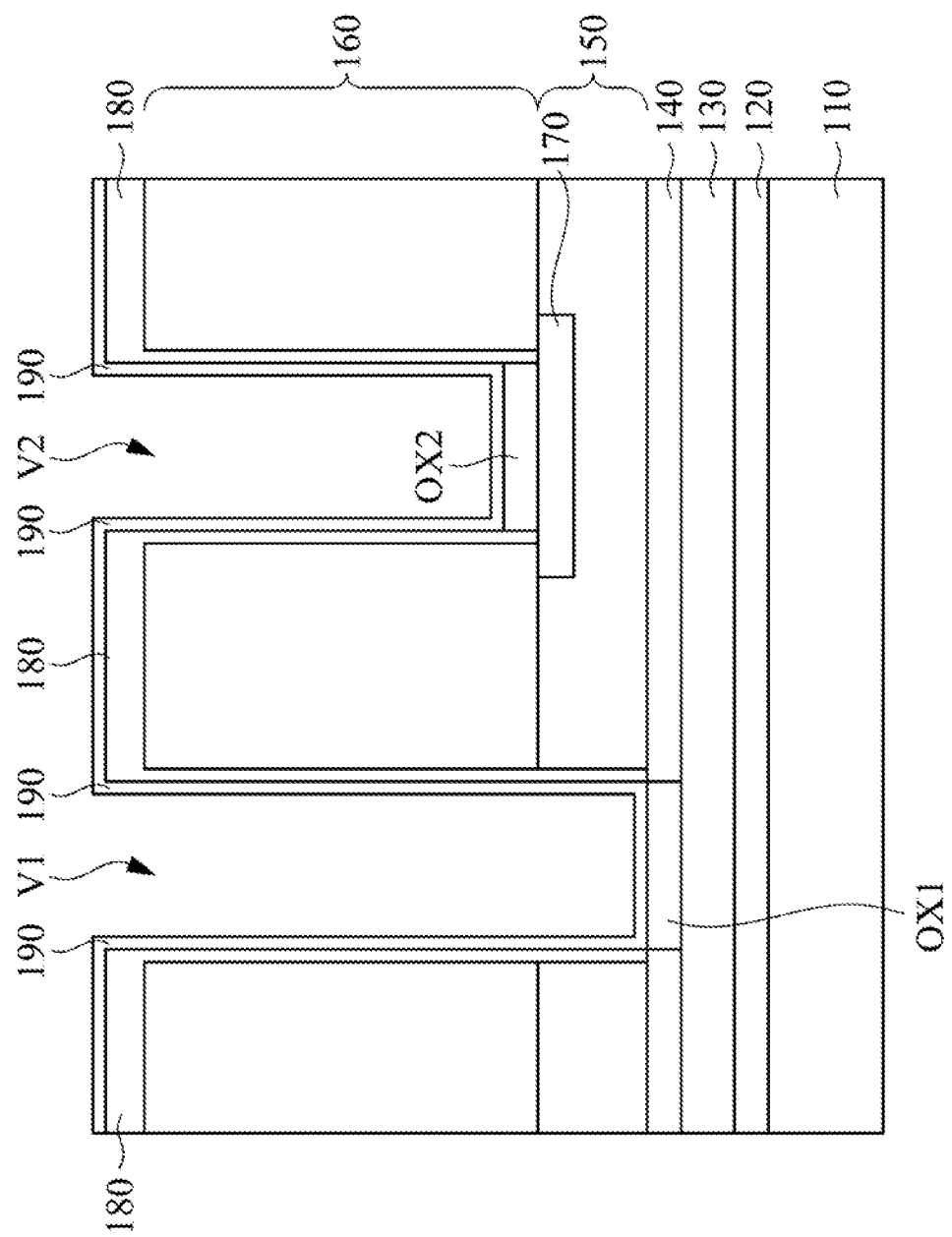
FIG. 7 is a cross-sectional view of an intermediate stage of manufacturing the semiconductor device in accordance with an embodiment of present invention.

Reference is made to FIG. 2 and FIG. 7. FIG. 7 is a cross-sectional view of an intermediate stage of manufacturing a semiconductor device 100 in accordance with an embodiment of the present invention. As shown in FIG. 7, the third barrier layer 190 is formed in step S104. Specifically, the third barrier layer 190 is deposited on the bottom and the inner sidewalls of the first via V1 and the second via V2. This ensures that the first via V1 and the second via V2 are lined by the third barrier layer 190 during the forming of step S104. In some embodiments, as shown in FIG. 7, the third barrier layer 190 covers the first oxide OX1 and the second oxide OX2.

In some embodiments, step S104 is performed after step S102.

In some embodiments, the third barrier layer 190 may include a material, such as tantalum (Ta), tantalum nitride (TaN), titanium (Ti), titanium nitride ($Ti_xN_y$), or the like. However, any suitable material may be utilized.

In some embodiments, the third barrier layer 190 may be deposited by a blanket depositing process. The present disclosure is not intended to limit the methods of depositing the third barrier layer 190.

In some embodiments, the third barrier layer 190 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the third barrier layer 190.

In step S105, the first oxide OX1 and the second oxide OX2 formed from the exposed first metal 130 and the exposed second metal 170 are removed and a re-sputtered first metal RM1 and a re-sputtered second metal RM2 are formed at least on lower portions of the inner sidewalls of the first via V1 and the second via V2, respectively.

Figure 8:
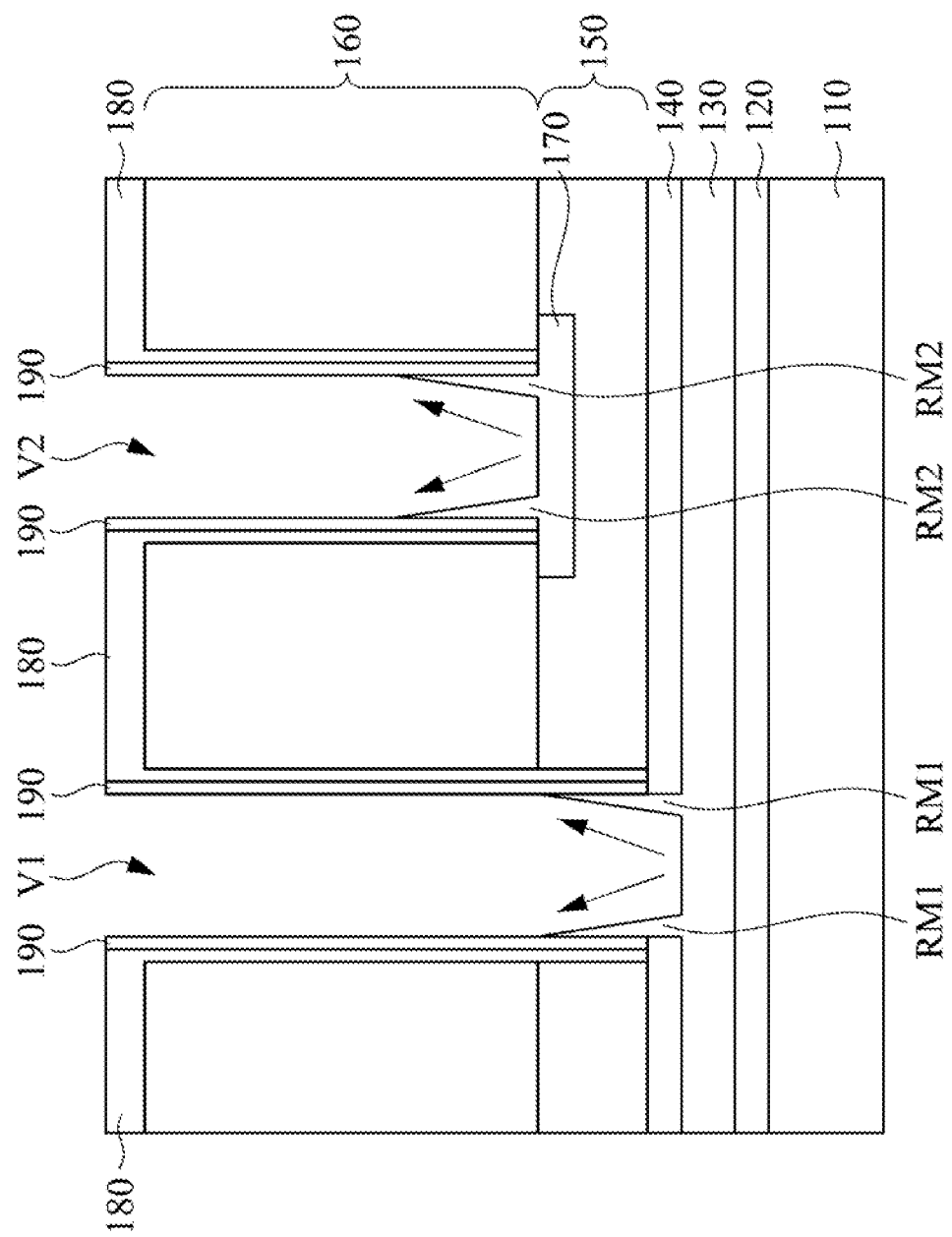
FIG. 8 is a cross-sectional view of an intermediate stage of manufacturing the semiconductor device in accordance with an embodiment of present invention.

Reference is made to FIG. 2 and FIG. 8. FIG. 8 is a cross-sectional view of an intermediate stage of manufacturing a semiconductor device 100 in accordance with an embodiment of the present invention. As shown in FIG. 8, the first oxide OX1 and the second oxide OX2 are removed. In some embodiments, the first oxide OX1 and the second oxide OX2 may be removed by, for example, a sputter cleaning process due to the stiffness of the first oxide OX1 and/or the second oxides OX2. In some embodiments in which the first oxide OX1 and the second oxide OX2 are removed by the sputter cleaning process, the first metal 130 and the second metal 170 may be re-sputtered, such that the re-sputtered first metal RM1 and the re-sputtered second metal RM2 are formed at least on lower portions of the inner sidewalls of the first via V1 and the second via V2, respectively. Specifically, the re-sputtered first metal RM1 is formed from and the same as the first metal 130, and the re-sputtered second metal RM2 is formed from and the same as the second metal 170. As shown in FIG. 5, the re-sputtered first metal RM1 and the re-sputtered second metal RM2 are formed on the third barrier layer 190, so that the re-sputtered first metal RM1 and the re-sputtered second metal RM2 are separated from the third dielectric layer 180 by the third barrier layer 190. This may lower the leakage risk caused by possible metal contamination affecting the third dielectric layer 180.

In some embodiments, a portion of the third barrier layer 190 on the bottom of the first via V1 and a portion of the third barrier layer 190 on the third dielectric layer 180 (for example, a portion of the third barrier layer 190 over the substrate 160) are removed during performing step S105.

In some embodiments, the first oxide OX1 and the second oxide OX2 may be removed by in-situ argon (Ar) plasma sputter clean process, but the present disclosure is not intended to limit the methods of removing the first oxide OX1 and the second oxide OX2.

In step S106, a fourth barrier layer 195 is formed over the substrate 160 and the bottom and the inner sidewalls of the first via V1 and the second via V2.

Figure 9:
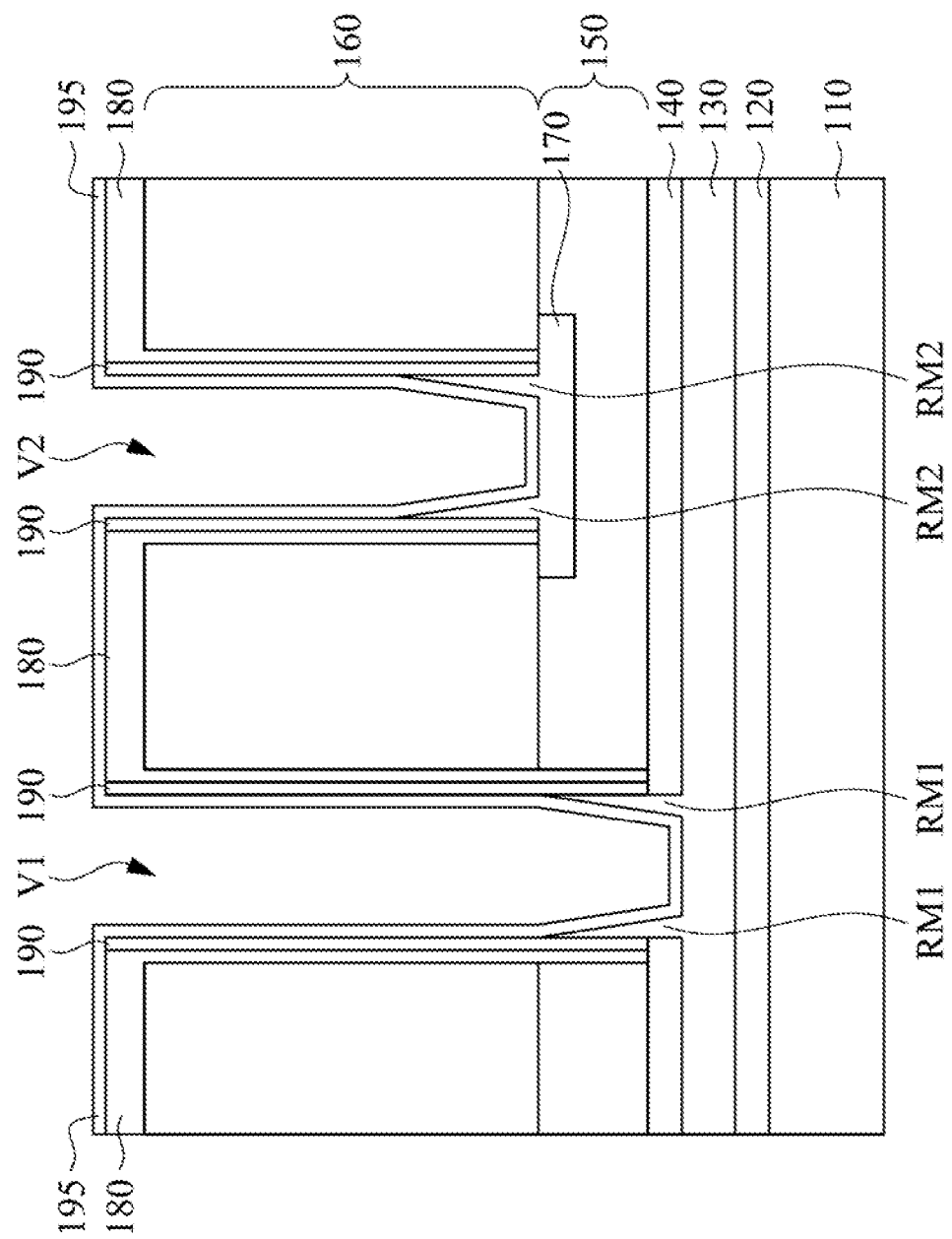
FIG. 9 is a cross-sectional view of an intermediate stage of manufacturing the semiconductor device in accordance with an embodiment of present invention.
Figure 10:
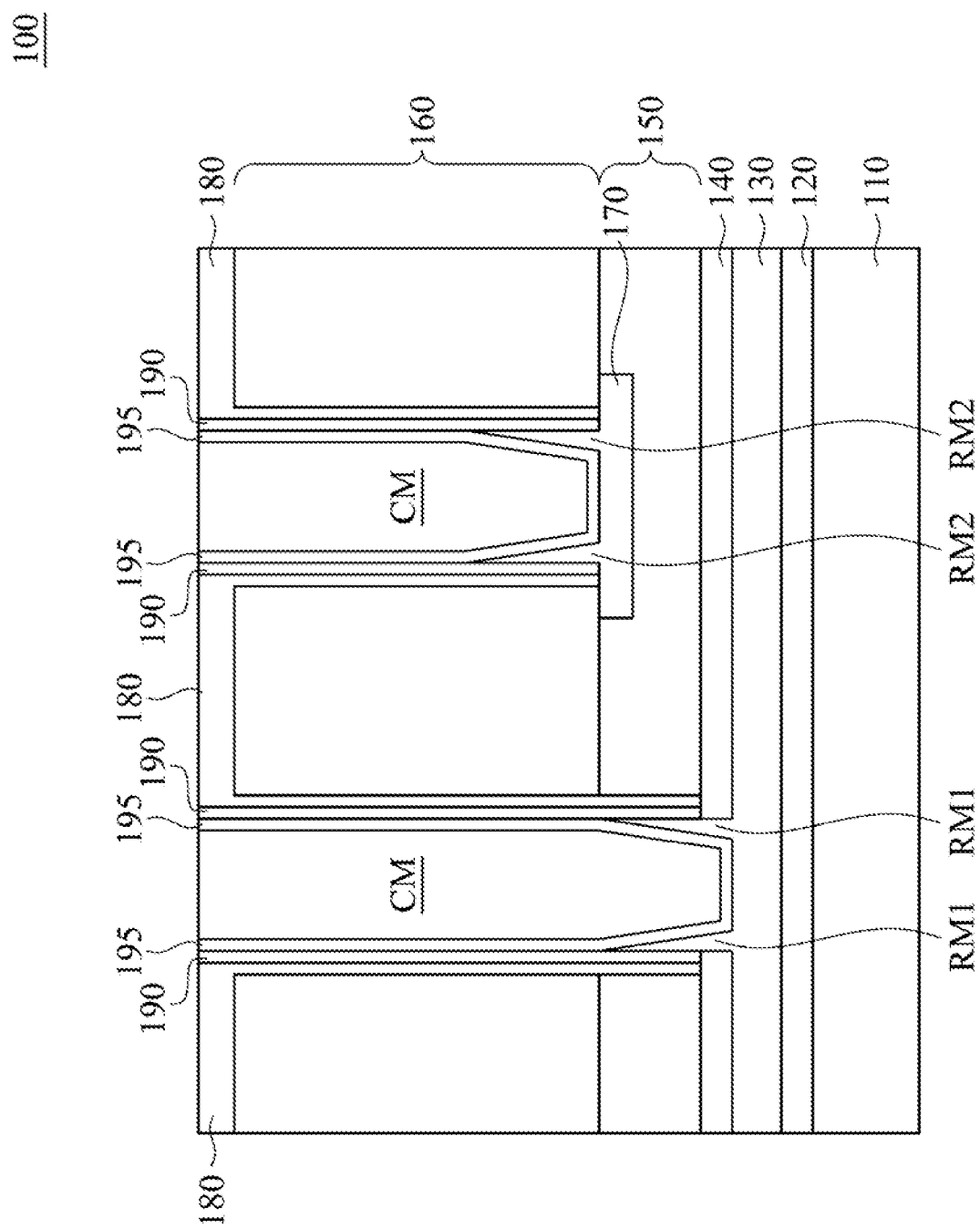
FIG. 10 is a cross-sectional view of an intermediate stage of manufacturing the semiconductor device in accordance with an embodiment of present invention.

Reference is made to FIG. 2 and FIG. 9. FIG. 9 is a cross-sectional view of an intermediate stage of manufacturing a semiconductor device 100 in accordance with an embodiment of the present disclosure. As shown in FIG. 9, the fourth barrier layer 195 is formed in step S106. Specifically, the fourth barrier layer 195 is deposited on the third barrier layer 190 which is formed on the substrate 160 and the bottom and the inner sidewalls of the first via V1 and the second via V2. As shown in FIG. 9, the fourth barrier layer 195 is deposited, so that the fourth barrier layer 195 covers a portion of the third dielectric layer 180 which is directly on the substrate 160, a portion of the third barrier layer 190 which is lined on the third dielectric layer 180, the re-sputtered first metal RM1, the re-sputtered second metal RM2, the first metal 130, and the second metal 170. This ensures that the first via V1 and the second via V2 are lined with the fourth barrier layer 195 during the depositing of step S106. In some embodiments, as shown in FIG. 9, the re-sputtered first metal RM1 and the re-sputtered second metal RM2 are sandwiched between the third barrier layer 190 and the fourth barrier layer 195 on the bottom of the first via V1 and the second via V2, respectively.

In some embodiments, the fourth barrier layer 195 includes a seed layer, so that the seed layer is also formed on the substrate 160 and the bottom and the inner sidewalls of the first via V1 and the second via V2. In some embodiments, the seed layer is configured as a seed layer for the growth of conductive materials.

In some embodiments, step S106 is performed after step S104.

In some embodiments, the fourth barrier layer 195 may include a material, such as tantalum (Ta), tantalum nitride (TaN), titanium (Ti), titanium nitride ($Ti_xN_y$), or the like. However, any suitable material may be utilized.

In some embodiments, a material of the third barrier layer 190 and a material of the fourth barrier layer 195 are identical.

In some embodiments, the fourth barrier layer 195 may be deposited by a blanket depositing process. The present disclosure is not intended to limit the methods of depositing the fourth barrier layer 195.

In some embodiments, the fourth barrier layer 195 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the fourth barrier layer 195.

In step S107, a conductive material CM is formed in the first via V1 and the second via V2.

Reference is made to FIG. 2 and FIG. 10. FIG. 10 is a cross-sectional view of an intermediate stage of manufacturing a semiconductor device 100 in accordance with an embodiment of the present disclosure. As shown in FIG. 10, the conductive material CM is formed in step S106. Specifically, the conductive material CM is deposited in the first via V1 and the second via V2. This ensures that the first via V1 and the second via V2 are fully filled with the conductive material CM during the depositing of step S107.

In some embodiments, the step of forming the seed layer in step S106 is performed before step S107.

In some embodiments, the forming of the conductive material CM further includes a step of filling the conductive material CM in the first via V1 and the second via V2 and a step of removing a portion of the fourth barrier layer 195 on the third dielectric layer 180 and a portion of the conductive material CM. In some embodiments, the conductive material CM may be overfilled, so that the conductive material CM may cover a whole top surface of the semiconductor structure. Next, the portion of the fourth barrier layer 195 on the third dielectric layer 180 and the portion of the conductive material CM are removed, such that the conductive material CM is leveled with the third dielectric layer 180. More specifically, as shown in FIG. 10, a top surface of the conductive material CM is leveled with a top surface of the third dielectric layer 180.

In some embodiments, the conductive material CM may include a material, such as copper (Cu), or the like. However, any suitable material may be utilized.

In some embodiments, a material of the conductive material CM and a material of the first metal 130 are identical.

In some embodiments, the conductive material CM may be filled into the first via V1 and the second via V2 by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of filling the conductive material CM into the first via V1 and the second via V2.

In some embodiments, the portion of the fourth barrier layer 195 on the third dielectric layer 180 and the portion of the conductive material CM may be removed by, for example, chemical mechanical polarization process, or the like. The present disclosure is not intended to limit the methods of removing the conductive material CM.

By performing the method M shown in FIG. 1 and FIG. 2 of the present disclosure, the semiconductor device 100 with better electrical performance may be formed.

Based on the above discussions, it can be seen that the semiconductor device 100 of the present disclosure offers advantages. It is understood, however, that other embodiments may offer additional advantages, and not all advantages are necessarily disclosed herein, and that no particular advantages are required for all embodiments. One advantage is that since the steps of forming the third barrier layer and the fourth barrier layer are performed (i.e., two steps of sputtering for forming barrier layers), the re-sputtered first metal and the re-sputtered second metal can be separated from the dielectric layers (e.g. the third dielectric layer), thereby reducing the probability of leakage, and improving its electrical performance.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A semiconductor device, comprising:
   a first dielectric layer;
   a first barrier layer on the first dielectric layer;
   a first metal on the first barrier layer;
   a second barrier layer on the first metal;
   a second dielectric layer on the second barrier layer;
   a second metal over the first metal and disposed in the second dielectric layer;
   a substrate on the second dielectric layer, wherein a first via runs through the substrate and the second dielectric layer to connect to the first metal, and a second via at least runs through the substrate to connect to the second metal;
   a third dielectric layer on the substrate and inner sidewalls of the first via and the second via;
   a third barrier layer on the third dielectric layer and the inner sidewalls of the first via and the second via;
   a re-sputtered first metal and a re-sputtered second metal at least on lower portions of the inner sidewalls of the first via and the second via respectively, wherein the re-sputtered first metal and the re-sputtered second metal are separated from the third dielectric layer by the third barrier layer;
   a fourth barrier layer on the third barrier layer and on a bottom and the inner sidewalls of the first via and the second via, wherein the fourth barrier layer covers the re-sputtered first metal and the re-sputtered second metal; and a conductive material filled in the first via and the second via.

2. The semiconductor device of claim 1, wherein the re-sputtered first metal and the re-sputtered second metal are formed from the first metal and the second metal, respectively.

3. The semiconductor device of claim 1, wherein the re-sputtered first metal and the re-sputtered second metal are sandwiched between the third barrier layer and the fourth barrier layer.

4. The semiconductor device of claim 1, wherein a material of the first dielectric layer, a material of the second dielectric layer, and a material of the third dielectric layer are identical.

5. The semiconductor device of claim 1, wherein a material of the first barrier layer and a material of the second barrier layer are identical.

6. The semiconductor device of claim 1, wherein a material of the third barrier layer and a material of the fourth barrier layer are identical.

7. The semiconductor device of claim 1, wherein a material of the conductive material and a material of the first metal are identical.

8. The semiconductor device of claim 1, wherein the conductive material is leveled with the third dielectric layer.

\* \* \* \* \*